United States Patent
Semanson et al.

(10) Patent No.: US 9,906,069 B2
(45) Date of Patent: Feb. 27, 2018

(54) VEHICLE BATTERY STATUS DETECTION BY TRACKING A TEMPERATURE GRADIENT

(71) Applicant: Ford Global Technologies, LLC, Dearborn, MI (US)

(72) Inventors: Christopher Semanson, Dearborn, MI (US); Jeremy L. Russell, Livonia, MI (US); Cathleen Tistle, Manchester, MI (US); Jeff Raymond Mohr, Mt. Clemens, MI (US); Mark Eifert, Hessen (DE)

(73) Assignee: Ford Global Technologies, LLC, Dearborn, MI (US)

( * ) Notice: Subject to any disclaimer, the term of this patent is extended or adjusted under 35 U.S.C. 154(b) by 608 days.

(21) Appl. No.: 14/444,971

(22) Filed: Jul. 28, 2014

(65) Prior Publication Data

US 2016/0025813 A1    Jan. 28, 2016

(51) Int. Cl.
| | |
|---|---|
| H02J 7/04 | (2006.01) |
| H02J 7/16 | (2006.01) |
| G01R 31/36 | (2006.01) |
| B60L 11/18 | (2006.01) |
| H02J 7/14 | (2006.01) |
| H02J 7/00 | (2006.01) |
| G01K 3/10 | (2006.01) |

(52) U.S. Cl.
CPC .......... *H02J 7/047* (2013.01); *B60L 11/1872* (2013.01); *G01K 3/10* (2013.01); *G01R 31/3606* (2013.01); *H02J 7/0091* (2013.01); *H02J 7/1453* (2013.01); *G01K 2205/00* (2013.01)

(58) Field of Classification Search
CPC ........ H02J 7/0091; H02J 7/047; H02J 7/1453; G01R 31/3675; G01R 31/367
USPC .................................................. 320/144, 153
See application file for complete search history.

(56) References Cited

U.S. PATENT DOCUMENTS

| | | | |
|---|---|---|---|
| 6,057,671 A | 5/2000 | Kuno | |
| 6,172,487 B1 | 1/2001 | Brotto | |
| 6,380,717 B2 * | 4/2002 | Murakami | .......... H01M 10/443 320/150 |
| 6,489,751 B2 | 12/2002 | Small | |
| 2001/0001533 A1 * | 5/2001 | Stuck Andersen | ... H01M 10/44 320/150 |

* cited by examiner

*Primary Examiner* — David V Henze-Gongola
(74) *Attorney, Agent, or Firm* — James P. Muraff; Neal, Gerber & Eisenberg LLP

(57) ABSTRACT

This disclosure generally relates to a system, apparatus, and method for diagnosing a vehicle battery for further charging purposes. A battery diagnostic tool is provided to receive temperature information on the vehicle battery during a vehicle battery charging operation. The temperature information is referenced to generate a temperature gradient that will be further referenced to identify temperature changes to the vehicle battery over a period of time.

15 Claims, 3 Drawing Sheets

VEHICLE BATTERY STATUS DETECTION BY TRACKING A TEMPERATURE GRADIENT

TECHNICAL FIELD

This disclosure generally relates to a vehicle battery status detection system, apparatus and method for detecting the status of a vehicle battery by tracking a temperature gradient of the vehicle battery.

BACKGROUND

A vehicle may include one or more batteries for operating one or more vehicle components. For example, a 12 V battery may be included for providing the power to operate one or more electrical components of a vehicle. Further, in a hybrid or electric vehicle, one or more additional batteries may be included on the vehicle for powering, at least in part, the propulsion system of the vehicle.

It follows that maintaining an adequate level of charge in the vehicle's one or more batteries is important to ensure certain components of the vehicle will be properly operational.

SUMMARY

This application is defined by the appended claims. The description summarizes aspects of the embodiments and should not be used to limit the claims. Other implementations are contemplated in accordance with the techniques described herein, as will be apparent upon examination of the following drawings and detailed description, and such implementations are intended to be within the scope of this application.

Exemplary embodiments provide a battery diagnostic tool configured to sense and track a temperature of one or more batteries included in a vehicle. More specifically, during a vehicle battery charging process, the battery detection tool may determine a temperature gradient by sensing a change in temperature over a period of time for a vehicle battery. The battery diagnostic tool may then assign a fault value to the temperature gradient, where the fault value may correspond to a severity of the temperature gradient for the vehicle battery. The battery diagnostic tool may then analyze the temperature gradient to determine whether to implement a remedial feature to the vehicle battery charging process.

It follows that according to some embodiments, an apparatus for tracking a performance of a vehicle battery is provided. The apparatus may include a memory configured to store a fault count threshold; a processor in communication with the memory, the processor configured to: generate a temperature gradient that measures a change in a vehicle battery temperature over a period of time; assign the temperature gradient to a corresponding fault value, and determine whether the fault value exceeds the fault count threshold.

According to some embodiments, a method for tracking a temperature of a vehicle battery is provided. The method may comprise causing a fault count threshold to be stored in a memory; generating a temperature gradient that measures a change in vehicle battery temperature over a period of time; assigning the temperature gradient to a corresponding fault value, and determining whether the fault value exceeds the fault value threshold.

According to some embodiments, a battery diagnostic system is provided. The system may comprise a memory configured to store a fault count threshold; a temperature sensor configured to sense a vehicle battery temperature; a processor in communication with the memory, the processor configured to: generate a temperature gradient that measures a change in vehicle battery temperature over a period of time; assign the temperature gradient to a corresponding fault value, and determine whether the fault value exceeds the fault count threshold.

BRIEF DESCRIPTION OF THE DRAWINGS

For a better understanding of the invention, reference may be made to embodiments shown in the following drawings. The components in the drawings are not necessarily to scale and related elements may be omitted so as to emphasize and clearly illustrate the novel features described herein. In addition, system components can be variously arranged, as known in the art. In the figures, like referenced numerals may refer to like parts throughout the different figures unless otherwise specified.

DETAILED DESCRIPTION OF EXAMPLE EMBODIMENTS

Figure 1:
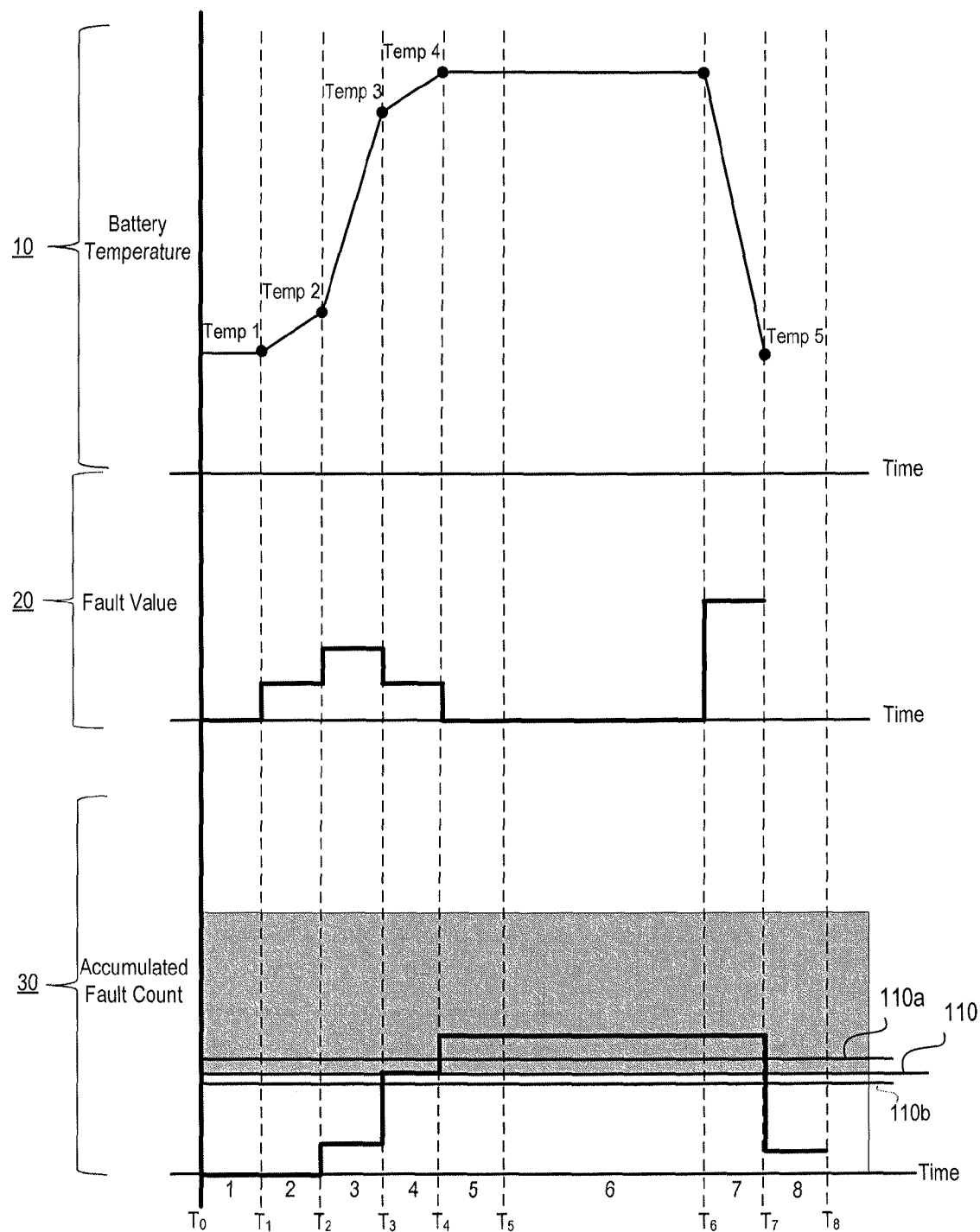
FIG. 1 illustrates an exemplary graph that describes the measurement of temperature changes of a vehicle battery over a period of time, according to some embodiments.

While the invention may be embodied in various forms, there are shown in the drawings, and will hereinafter be described, some exemplary and non-limiting embodiments, with the understanding that the present disclosure is to be considered an exemplification of the invention and is not intended to limit the invention to the specific embodiments illustrated. Not all of the depicted components described in this disclosure may be required, however, and some implementations may include additional, different, or fewer components from those expressly described in this disclosure. Variations in the arrangement and type of the components may be made without departing from the spirit or scope of the claims as set forth herein.

A vehicle's battery is utilized for powering various components included in the overall vehicle system. For example, the vehicle may include a 12 volt battery for powering various lighting (e.g., instrument panel lighting, headlights, interior lighting, infotainment lighting, etc.) and electrical systems (e.g., power windows and locks, infotainment system, navigation system, etc.) included in the vehicle system. In a hybrid or electric vehicle, a separate battery (e.g., lead-acid battery, Nickel-metal hydride battery, or Lithium-ion battery) may be dedicated to power, at least in part, the propulsion of the vehicle. In either scenario, maintaining an accurate diagnostic of the health of the vehicle battery is important to ensure the vehicle battery is charging properly. For example, the identification of a drastic temperature change in the vehicle battery, or an identification of high temperature in the vehicle battery, may be symptomatic of a degraded vehicle battery that is charged too aggressively.

Previous vehicle battery diagnostic models have simply measured a temperature change of the vehicle battery during a vehicle battery charging operation and shut down the vehicle battery charging operation when the temperature change reached a predetermined limit or when the vehicle battery reached a predetermined limit. While such diagnostic models may have identified large changes in vehicle battery temperatures, they could not account for smaller changes in vehicle battery temperature that may also be important to identify as a precursor to a larger vehicle battery charging issue.

It is therefore a goal of the present disclosure to describe a system, apparatus, and method, among other innovations, capable of providing an accurate diagnostic of the vehicle battery during a vehicle battery charging operation.

The battery diagnostic tool may be a program, application, and/or some combination of software and hardware that is incorporated on one or more of the components that comprise the vehicle's operating system. Further description for the battery diagnostic tool and the components of the vehicle system running the battery diagnostic tool is described in more detail below.

The battery diagnostic tool may receive temperature information that identifies an average value of the temperatures of the cells in a vehicle battery (simply referred to as the battery temperature henceforth in this disclosure) sensed by a temperature sensor during a vehicle battery charging operation. The battery diagnostic tool may continue to receive the temperature information from the temperature sensor over a period of time. Based on the received temperature information, the battery diagnostic tool may generate a temperature gradient value that calculates a change in temperature of the vehicle battery over a change in time (i.e., over the period of time the change in battery temperature is measured). This temperature gradient value may be generated by the battery diagnostic tool over successive periods of time, where each successive period of time may be the same length. The battery diagnostic tool may further utilize the temperature gradient value when performing a diagnostic of the vehicle battery.

For example, the battery diagnostic tool may assign a corresponding fault value based on the temperature gradient. The fault value may be part of a list of fault values stored on a memory included in the vehicle system, and have a range of values from low to high. The list of fault values may be organized as a lookup table such that certain temperature gradients will be assigned to certain fault values. For instance, a low temperature gradient, or low range of temperature gradient values, may be assigned to a low fault value. A higher temperature gradient, or range of higher temperature gradient values, may be assigned to a higher fault value. The lookup table may have been pre-populated with fault values that may be assigned to specific temperature gradient values, or specific ranges of temperature gradient values. For example, the lookup table may identify a low range of temperature gradient values that may be assigned a low fault value. (e.g., zero (0)). The lookup table may also identify a low-middle range of temperature gradient values that may be assigned a low-middle fault value (e.g., one (1)). The lookup table may also identify a middle range of temperature gradient values that may be assigned a middle fault value (e.g., two (2)). The lookup table may also identify a high-middle range of temperature gradient values that may be assigned a high-middle fault value (e.g., three (3)). The lookup table may also identify a high range of temperature gradient values that may be assigned a high fault value (e.g., four (4)). The identified ranges of temperature gradient values and the corresponding fault values are provided for exemplary purposes only, as it is within the scope of this disclosure to have the lookup table configured to include a fewer, or greater, number of temperature gradient value ranges and corresponding fault values.

Further description of how the battery diagnostic tool may further reference and utilize the temperature gradient values and fault values is provided in detail below.

FIG. 1 illustrates a first graph 10 that identifies a battery temperature of a vehicle battery (e.g., battery electrolyte temperature) that is plotted against time during a vehicle battery charging operation. The temperature information from the first graph 10 may be referenced by the battery diagnostic tool to generate a temperature gradient for one or more of the time periods. FIG. 1 also illustrates a second graph 20 that identifies a fault value assigned by the battery diagnostic tool to a particular time period with respect to a temperature gradient generated for that time period. FIG. 1 also illustrates a third graph 30 that identifies the battery diagnostic tool keeping track of an accumulated fault count value. The accumulated fault count is the accumulated sum of previously generated fault values that have been assigned to previous time periods. Further description on the relationship between temperature gradients, fault values, and the accumulated fault count values will be provided in more detail below. Each of the first graph 10, second graph 20, and third graph 30 are plotted against the same time scale.

It should be noted that the time intervals (e.g., time between $T_1$ and $T_2$) identified in FIG. 1 correspond to a set time period that will be referenced as the change in time during the generation of a temperature gradient as described in more detail below. It follows that the time period may be a predetermined set time period (e.g., 15 minutes) that will be referenced for generating a temperature gradient according to some embodiments.

The first graph 10 identifies a temperature of the vehicle battery in terms of the battery electrolyte temperature during the vehicle battery charging operation. In the first time period (e.g., the first time period runs from $T_0$ to $T_1$), the temperature is seen to remain steady without any increases or decreases (i.e., no temperature changes). It follows that during such a time period where the vehicle battery temperature does not change, the battery diagnosis tool may generate a corresponding temperature gradient value to be zero because there is no change in battery temperature.

Based on the zero value temperature gradient for the first time period, it follows that the battery diagnosis tool may also assign a correspondingly low (e.g., zero) fault value to the first time period. In other words, when the temperature gradient value is zero, or some other relatively low value, the battery diagnostic tool may assign a similarly low fault value such as, for example as illustrated in FIG. 1, zero. It follows that in the embodiment illustrated by FIG. 1, the second graph 20 illustrates the battery diagnostic tool assigning a low fault value (e.g., zero) to the first time period based on the low temperature gradient values (e.g., zero) generated for the first time period.

With respect to the third graph 30, the third graph 30 represents the summation of previously accumulated fault values from previous time periods. The accumulated fault count plotted in the third graph 30 is plotted against the same time period as referenced in the first graph. 10 and second graph 20. It follows that in the first time period (e.g., from $T_0$ to $T_1$), the third graph 30 plots a zero value due to no previously generated temperature gradient values, which in turn means no previously assigned fault values.

In terms of the second time period (e.g., the second time period runs from $T_1$ to $T_2$), the first graph 10 displays the temperature of the vehicle battery increasing from Temp 1 to Temp 2. This increase in vehicle battery temperature during the second time period allows the battery diagnostic tool to generate a corresponding temperature gradient with a positive value. This in turn may cause the battery diagnostic tool to assign a corresponding fault value to the second time period with a positive value. For example, the battery diagnostic tool may reference a lookup table of fault values stored in a memory of the vehicle system to look up the fault value that corresponds to the temperature gradient generated for the second time period. The lookup table may be configured according to any one or more lookup table of fault values described in this disclosure. Then based on the temperature gradient value for the second time period, the lookup table may assign a corresponding fault value. It follows that in the embodiment illustrated by the second graph 20 in FIG. 1, the second graph 20 illustrates the battery diagnostic tool assigning at least a low-middle or middle fault value in the second time period based on the temperature gradient generated for the second time period.

Then for the second time period (e.g., from $T_1$ to $T_2$), the third graph 30 displays a summation of the fault values assigned to previous time periods, which in this case only refers to the fault value assigned to the first time period. In the embodiment illustrated by FIG. 1, the fault value assigned to the first time period is zero, and therefore the third graph 30 will still only display a zero value for the accumulated fault count value in the second time period.

In terms of the third time period (e.g., the third time period runs from $T_2$ to $T_3$), the first graph 10 displays the temperature of the vehicle battery increasing from Temp 2 to Temp 3. This increase in vehicle battery temperature during the third time period allows the battery diagnostic tool to generate a corresponding temperature gradient with a positive value. This in turn may cause the battery diagnostic tool to assign a corresponding fault value to the third time period with a positive value. For example, the battery diagnostic tool may reference a lookup table of fault values stored in a memory of the vehicle system to look up the fault value that corresponds to the temperature gradient generated for the third time period. The lookup table may be configured according to any one or more lookup table of fault values described in this disclosure. Then based on the temperature gradient value for the third time period, the lookup table may assign a corresponding fault value. It follows that in the embodiment illustrated by the second graph 20 in FIG. 1, the battery diagnostic tool is illustrated as assigning at least a middle or high-middle fault value to the third time period based on the temperature gradient generated for the third time period. It follows that because the change in battery temperature during the third time period is seen to be greater than the change in battery temperature during the second time period, the corresponding time gradient value generated for the third time period will be greater than the corresponding time gradient value generated for the second time period. It also follows that the fault value assigned to the third time period may be greater in value than the fault value assigned to the second time period.

As the third graph 30 plots a summation of successive fault values assigned to successive time periods by the battery diagnostic tool, it follows that the accumulated fault count value illustrated for the third time period corresponds to a summation of previous fault values assigned to the first time period and second time period. In the embodiment illustrated by FIG. 1 the fault values assigned to the first is zero, however the fault value assigned to the second time period has a positive value (e.g., low-middle or middle fault value), and therefore the accumulated fault count value for the third time period will be the summation of zero (from the first time period) and the fault value assigned to the second time period (e.g., low-middle or middle fault value). It should be noted that the accumulated fault count value is still below the fault count threshold 110 during the third time period.

In terms of the fourth time period (e.g., the fourth time period runs from $T_3$ to $T_4$), the first graph 10 displays the temperature of the vehicle battery increasing from Temp 3 to Temp 4. This increase in vehicle battery temperature during the fourth time period allows the battery diagnostic tool to generate a corresponding temperature gradient with a positive value. This in turn may cause the battery diagnostic tool to assign a corresponding fault value to the fourth time period with a positive value. For example, the battery diagnostic tool may reference a lookup table of fault values stored in a memory of the vehicle system to look up the fault value that corresponds to the temperature gradient generated for the fourth time period. The lookup table may be configured according to any one or more lookup table of fault values described in this disclosure. Then based on the temperature gradient value for the fourth time period, the lookup table may assign a corresponding fault value. It follows that in the embodiment illustrated by the second graph 20 in FIG. 1, the battery diagnostic tool is illustrated as assigning at least a low-middle or middle fault value to the fourth time period based on the temperature gradient generated for the fourth time period. The temperature gradient for the fourth time period is seen to be similar to the temperature gradient for the second time period, and therefore the fault value assigned to the fourth time period may be similar, or the same, as the fault value assigned to the second time period. It also follows that because the change in battery temperature during the fourth time period is seen to be less than the change in battery temperature during the third time period, the corresponding time gradient value generated for the fourth time period will be less than the corresponding time gradient value generated for the third time period. Therefore the fault value assigned to the fourth time period may be less than the fault value assigned to the third time period.

As the third graph 30 plots a summation of successive fault values assigned to previous time periods by the battery diagnostic tool, it follows that the accumulated fault count value illustrated for the fourth time period corresponds to a summation of fault values assigned to the first time period, second time period, and third time period. In the embodiment illustrated by FIG. 1 the fault values assigned to the first time period is zero, and therefore the accumulated fault value count for the fourth time period will be the summation of zero (from the first time period), the fault value assigned to the second time period (e.g., low-middle or middle fault value), and the fault value assigned to the third time period (e.g., middle fault value or high-middle fault value). It should be noted that the accumulated fault count value is now at the fault count threshold 110 during the fourth time period. According to some embodiments, the battery diagnostic tool may allow the vehicle battery charging operation to continue when the accumulated fault count value is below or meets the actual fault count threshold 110. In other embodiments, the battery diagnostic tool may allow the vehicle battery charging operation to continue while the accumulated fault count value is within a buffer zone (high threshold buffer value 110*a*, and low threshold buffer value 110*b*) that surrounds the fault count threshold 110. In other embodiments, the battery diagnostic tool may not allow the vehicle battery charging operation to continue when the accumulated fault count value enters within a buffer zone (high threshold buffer value 110*a*, and low threshold buffer value 110*b*) that surrounds the fault count threshold 110, and will initiate remedial procedures when the accumulated fault count value enters within the buffer zone. In other embodiments, the battery diagnostic tool may initiate remedial procedures when the accumulated fault count value exceeds the fault count threshold. In other embodiments, the battery diagnostic tool may allow the vehicle battery charging operation to continue when the accumulated fault count value is below the fault count threshold 110, and will initiate remedial procedures when the accumulated fault count value meets or exceeds the fault count threshold.

In terms of the fifth time period (e.g., the first time period runs from $T_4$ to $T_5$), the first graph 10 illustrates that there is no change in battery temperature. It follows that during the fifth time period the battery diagnostic tool may generate a corresponding temperature gradient value to be zero because there is no change in battery temperature. Therefore the battery diagnostic tool may assign a low fault value (e.g., zero) for the fifth time period as illustrated in the second graph 20 of FIG. 1.

However, as the third graph 30 plots a summation of successive fault values assigned to previous time periods by the battery diagnostic tool, it follows that the accumulated fault count value illustrated for the fifth time period corresponds to a summation of fault values assigned to the first time period, second time period, third time period, and fourth time period. In the embodiment illustrated by FIG. 1 the fault values assigned to the first time period is zero, and therefore the accumulated fault value count for the fifth time period will be the summation of zero (from the first time period), the fault value assigned to the second time period (e.g., low-middle or middle fault value), the fault value assigned to the third time period (e.g., middle fault value or high-middle fault value), and the fault value assigned to the fourth time period (e.g., low-middle or middle fault value). It should be noted that the accumulated fault count value is now definitively over the fault count threshold 110, as well as over the buffer zone surrounding the fault count threshold during the fifth time period. Therefore, in recognition of this the battery diagnostic tool will initiate a remedial process. Further description for available remedial processes will be provided following the remaining description of the first graph 10, second graph 20, and third graph 30 illustrated in FIG. 1.

Following the initiation of the remedial process during either the fourth time period or fifth time period, depending on how the battery diagnostic tool treats the accumulation of the fault count values meeting the fault count threshold 110 and whether the buffer zone surrounding the fault count threshold 110 is implemented, the battery diagnostic tool may initiate a remedial process. The remedial process may last as long as the battery diagnostic tool detects the accumulated fault count value remains above the fault count threshold 110, above the fault count threshold 110 but outside of the buffer zone, or within the buffer zone, depending on the embodiment. However, in the exemplary case illustrated by FIG. 1, the remedial process may last at least from the fifth time period and continue throughout the seventh time period (e.g., lasting from $T_6$ to $T_7$).

During the seventh time period, the battery temperature of the vehicle battery is seen to decrease by a significant amount. This decrease in vehicle battery temperature will cause the battery diagnostic tool to generate a negative valued temperature gradient value. This in turn may cause the battery diagnostic tool to assign a corresponding fault value to the seventh time period with a negative value. For example, the battery diagnostic tool may reference a lookup table of fault values stored in a memory of the vehicle system to look up the fault value that corresponds to the temperature gradient having the negative value generated for the seventh time period. The lookup table may be configured according to any one or more lookup table of fault values described in this disclosure. In some embodiments, as illustrated in the second graph 20, the battery diagnostic tool may take the absolute value of the temperature gradient, identify the fault value from the lookup table using the absolute value of the temperature gradient, and then apply the negative sign in order to come up with the negative fault value assigned to the seventh time period. In other embodiments, the lookup table may be populated with separate fault value entries that correspond to negative temperature gradient values. Under either embodiment, the lookup table may be referenced to assign a corresponding fault value to the seventh time period based on the generated temperature gradient. The embodiment illustrated by graph 20 in FIG. 1 identifies the battery diagnostic tool assigning at least a high-middle or high fault value for the seventh time period based on the temperature gradient generated, in absolute terms, for the seventh time period. The fault value, in absolute terms, assigned to the seventh time period may have the greatest value based on the greatest change in temperature over the seventh time period.

As the third graph 30 plots a summation of successive fault values assigned to previous time periods by the battery diagnostic tool, it follows that the accumulated fault count value illustrated for the eighth time period (e.g., lasting from $T_7$ to $T_8$) corresponds to a summation of fault values assigned to the first time period, second time period, third time period, fourth time period, fifth time period, sixth time period, and seventh time period. In the embodiment illustrated by FIG. 1 the fault values assigned to the first, fifth, and sixth time periods is zero, and therefore the accumulated fault value count for the seventh time period will be the summation of zero (from the first, fifth, and sixth time periods), the fault value assigned to the second time period (e.g., low-middle or middle fault value), the fault value assigned to the third time period (e.g., middle fault value or high-middle fault value), the fault value assigned to the fourth time period (e.g., low-middle or middle fault value), and the fault value assigned to the seventh time period (e.g., high-middle or high fault value) which has a negative value. Due to the negative fault value assigned to the seventh time period, the accumulated fault count value will drop from the fault count value that is above the fault count threshold 110, to down below the fault count threshold 110 in the eight time period.

Then based on the accumulated fault count value falling below the fault count threshold 110, the battery diagnostic tool may re-initiate the previous (i.e., normal) vehicle battery charging operation.

The operational process of the battery diagnostic tool described with reference to FIG. 1 is provided for exemplary purposes, as modifications to the process are within the scope of the battery diagnostic tool described in this disclosure. For example, in some embodiments the accumulated fault count may be decremented or decreased by a predetermined amount after a predetermined length of time has passed with no temperature changes detected. The predetermined length of time may be measured in multiples of the time periods described with reference to FIG. 1.

Figure 2:
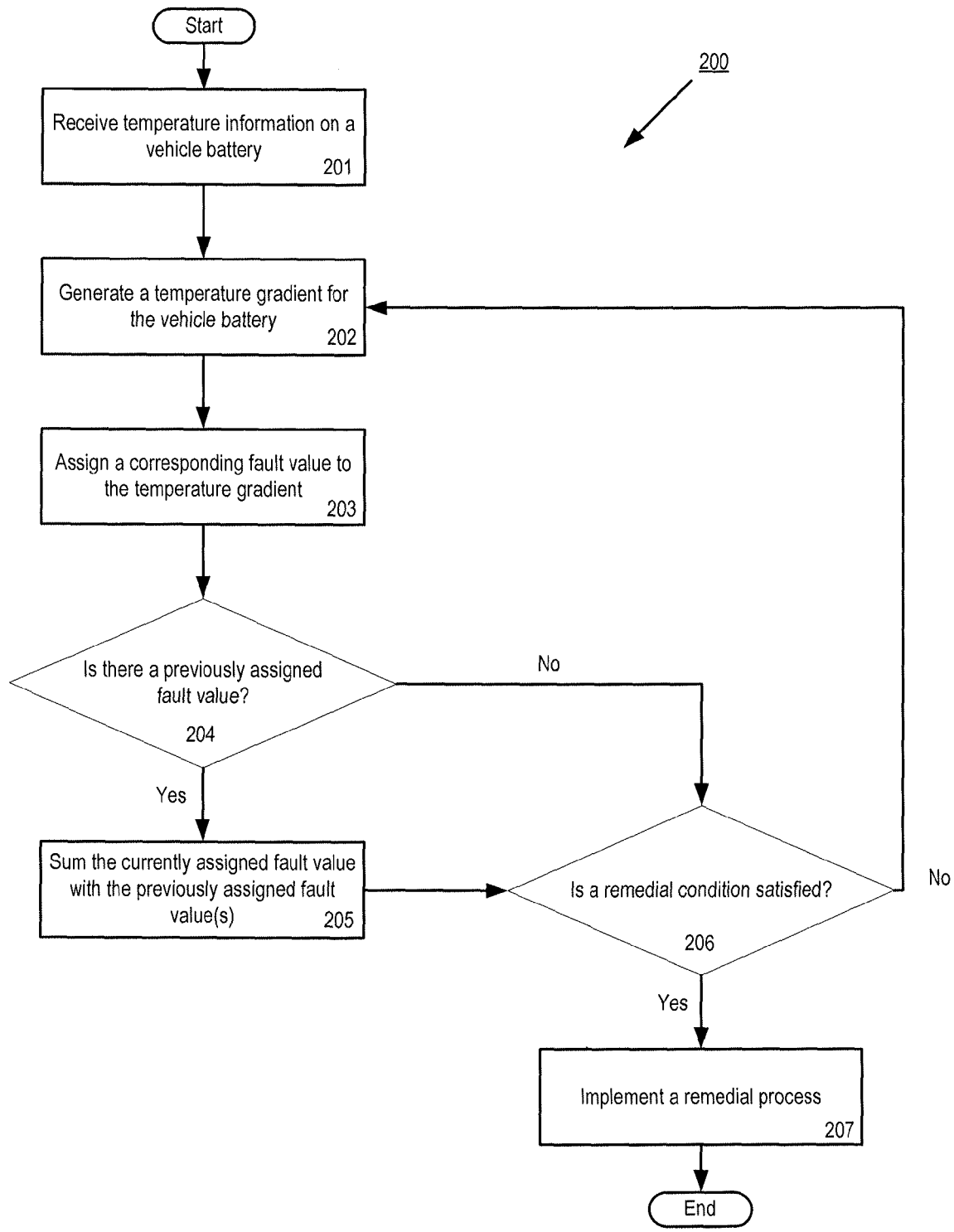
FIG. 2 illustrates an exemplary flow chart describing a process according to some embodiments.

FIG. 2 illustrates an exemplary flow chart 200 that describes a process for the battery diagnostic tool according to some embodiments. The process described by flow chart 200 describes exemplary steps that may be implemented by the battery diagnostic tool to achieve the monitoring and maintenance on the vehicle battery during a vehicle battery charging operation as described herein. The steps of the process described below is provided for exemplary purposes, as it is within the scope of this disclosure for the battery diagnostic tool to implement a greater, or fewer, number of steps in order to achieve the monitoring and maintenance features described herein. Further description is now provided describing the flow chart 200.

At 201, the battery diagnostic tool may receive temperature information that measures a battery temperature of a vehicle battery over a set period of time. The temperature information may have been measured by a battery temperature sensor that is part of the vehicle system.

At 202, the battery diagnostic tool may generate a temperature gradient for the vehicle battery by calculating a change in temperature over a change in time, where the change in time may correspond to set time periods (e.g., 15 minutes). The generation of the temperature gradient may be implemented by the battery diagnostic tool according to any one or more of the processes described herein. The temperature gradient may then be associated with the time period over which the temperature gradient was generated. It should be noted that in some embodiments the temperature measurements for generating the temperature gradient may be accepted and utilized by the battery diagnostic tool as soon as the vehicle battery charging operation is initiated. In other embodiments, the temperature measurements for generating the temperature gradient may be accepted and utilized by the battery diagnostic tool after a predetermined amount of time has passed since the start of the vehicle battery charging operation is initiated. In the embodiments where a predetermined amount of time is allowed to pass before the battery diagnostic tool begins to recognize the vehicle battery temperature measurements for generating the temperature gradient, this may be done to disregard any outlier information that may occur during the start of the vehicle battery charging operation.

At 203, a corresponding fault value may be assigned to the identified time period based on the temperature gradient generated for the time period. The assignment of the fault value may be implemented by the battery diagnostic tool according to any one or more of the processes described herein.

At 204, a determination is made by the battery diagnostic tool as to whether there exist previously assigned fault values for one or more preceding time periods. If such previously assigned fault values are detected, the process may proceed to 205 where the battery diagnostic tool may sum the previously assigned fault values with the current fault value assigned at 203. The summation of the fault values at 205 may correspond to the summation of the fault value assigned to the current time period (e.g., as assigned at 203) with all fault values that are assigned to time periods preceding the current time period. The preceding time periods may go back as far as the start of the vehicle battery charging operation, or to some other predetermined starting time known by the battery diagnostic tool. The summation of fault values may be implemented by the battery diagnostic tool according to any one or more of the processes described herein.

If previously assigned fault values are not detected, the process may proceed to 206.

At 206, the summation of the fault values up to the current time period is identified as the fault count value. If a remedial condition is satisfied, the process may proceed to 207 where a remedial process will be implemented by the battery diagnostic tool. The remedial condition may require that the summed total of fault values (i.e., the fault count value) at least meet, or exceed in some embodiments, a fault count threshold value as described herein.

The remedial condition may also look to determine whether the measured vehicle battery temperature has reached, or exceeded, a predetermined temperature. If the battery temperature has reached, or exceeded, the predetermined temperature, then the remedial condition may be considered to be satisfied and the process may proceed to implement the remedial process at 207.

At 207, the battery diagnostic tool may implement a remedial process. The remedial process may modify the current vehicle battery charging operation. For example, in some embodiments the remedial process may modify the current vehicle battery charging operation to cease charging the vehicle battery. In other embodiments, the remedial process may modify the current vehicle battery charging operation to continue charging the vehicle battery, albeit at a lower voltage.

Figure 3:
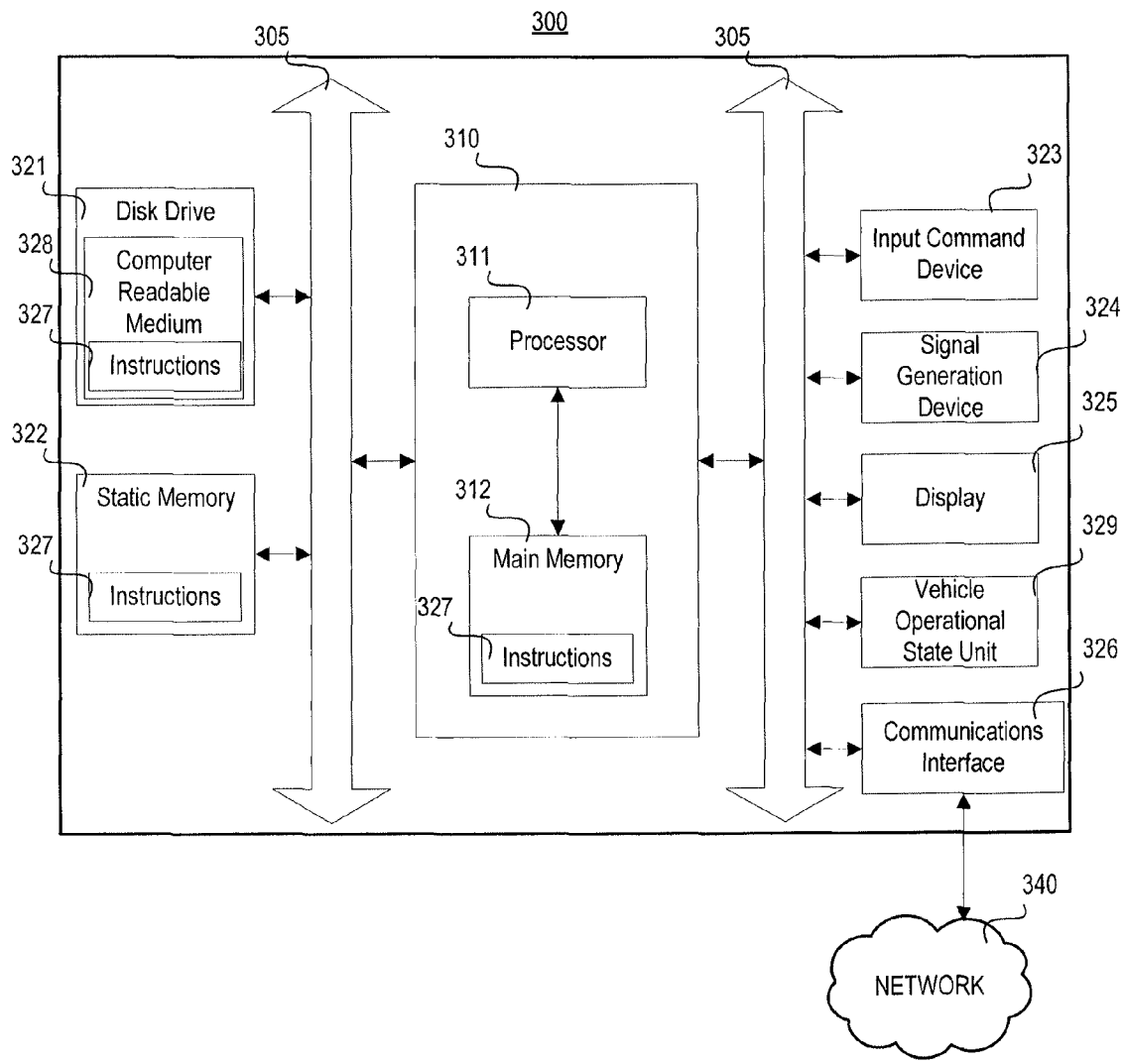
FIG. 3 illustrates an exemplary block diagram for a computing system that may be part of a vehicle system according to some embodiments.

Referring to FIG. 3, an illustrative embodiment of a computing system 300 that may be used as an apparatus within a vehicle system for implementing the any one or more of the methods, features, and processes of the battery diagnostic tool discussed herein, is shown and designated by the computing system 300.

The computing system 300 may include a processing unit 310 comprised of a processor 311 in communication with a main memory 312, wherein the main memory 312 stores a set of instructions 327 that may be executed by the processor 311 to cause the computing system 300 to perform any one or more of the methods, processes or computer-based functions disclosed herein. For example, the battery diagnostic tool described throughout this disclosure may be a program that is comprised of the set of instructions 327 that are executed to perform any one or more of the methods, processes or computer-based functions described herein such as the processes for achieving the diagnostic monitoring and maintenance on the vehicle battery described herein. Further, trouble code may be stored in any one or more of the main memory 312, static memory 322, or computer readable medium 328. The trouble code may identify and describe the situation (e.g., time of day, date, and duration of time, vehicle components operating) surrounding an instance where the temperature gradient for the vehicle battery is determined to surpass a threshold level (e.g., surpass a high level, thus indicating a significant change in battery temperature). The trouble code may also identify and describe the situation (e.g., time of day, date, and duration of time, vehicle components operating) surrounding an instance where the temperature for the vehicle battery is determined to surpass a threshold level (e.g., surpass a high level, thus indicating a significant battery temperature). Such trouble code may then be accessed to better understand the circumstances surrounding vehicle battery events.

The computing system 300 may be integrated into the vehicle. The computing system 300 may also be connected using a network such as network 340, to communicate with other computer systems or peripheral devices.

In a networked deployment, the computing system 300 may operate in the capacity of a server or as a client user computer within the vehicle system in a server-client user network environment, or as a peer computer system within a vehicle in a peer-to-peer (or distributed) network environment. Further, while a single computing system 300 is illustrated, the term "system" shall also be taken to include any collection of systems or sub-systems that individually or jointly execute a set, or multiple sets, of instructions to perform one or more computer functions.

As illustrated in FIG. 3, the computing system 300 may include the processor 311, such as a central processing unit ("CPU"), although the processor 311 may be representative of one or more processing units. Moreover, the computing system 300 can include the main memory 312 and a static memory 322 that can communicate with each other via a bus 305. As shown, the computing system 300 may further include a display unit 325, such as a liquid crystal display ("LCD"), an organic light emitting diode ("OLED"), a flat panel display, a solid state display, or a cathode ray tube ("CRT"). The display unit 325 may correspond to a display component of a navigation system, vehicle infotainment system, a heads-up display, or instrument panel of the vehicle described herein. Additionally, the computing system 300 may include one or more input command devices 323 for allowing a passenger of the vehicle to input modifications or updates to information referenced by the battery diagnostic tool as described herein. The input command devices may be a control knob, instrument panel, keyboard, scanner, digital camera for image capture and/or visual command recognition, touch screen or audio input device (e.g., cabin microphone), buttons, a mouse or touchpad. The computing system 300 can also include a disk drive unit 321 for receiving a computer readable medium 328. In a particular embodiment, the disk drive unit 321 may receive the computer-readable medium 328 in which one or more sets of instructions 327, such as the software corresponding to the battery diagnostic tool, can be embedded. Further, the instructions 327 may embody one or more of the methods or logic as described herein. In a particular embodiment, the instructions 327 may reside completely, or at least partially, within any one or more of the main memory 312, the static memory 322, computer readable medium 328, and/or within the processor 311 during execution of the instructions 327 by the processor 311.

The computing system 300 may also include a signal generation device 324, such as a speaker or remote control, and a vehicle operational state interface 329. The vehicle operational state unit 329 may be a component of the vehicle system configured to keep track of the measured vehicle battery temperature, generated temperature gradient values, whether the vehicle battery is currently being charged under normal operational conditions or under remedial conditions, and historical records of when the vehicle battery was charged under normal operational conditions and under remedial conditions. The information tracked by the vehicle operational state unit 329 may be stored in any one or more of the memories described herein as being a part of the computing system 300 or overall vehicle system. Such information tracked by the vehicle operational state unit 329 may also be transmitted to another server for further analysis via the network 340.

The computing system 300 may further include a communications interface 326. The communications interface 326 may be comprised of a network interface (either wired or wireless) for communication with an external network 340. The external network 340 may be a collection of one or more networks, including standards-based networks (e.g., 2G, 3G, 4G, Universal Mobile Telecommunications System (UMTS), GSM (R) Association, Long Term Evolution (LTE) (TM), or more), WiMAX, Bluetooth, near field communication (NFC), WiFi (including 802.11 a/b/g/n/ac or others), WiGig, Global Positioning System (GPS) networks, other telecommunications networks and others available at the time of the filing of this application or that may be developed in the future. Further, the network 340 may be a public network, such as the Internet, a private network, such as an intranet, or combinations thereof, and may utilize a variety of networking protocols now available or later developed including, but not limited to TCP/IP based networking protocols.

In some embodiments the program that embodies the battery diagnostic tool may be downloaded and stored on any one or more of the main memory 312, computer readable medium 328, or static memory 322 via transmission through the network 340 from an off-site server.

In an alternative embodiment, dedicated hardware implementations, including application specific integrated circuits, programmable logic arrays and other hardware devices, can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

In accordance with various embodiments of the present disclosure, the methods described herein may be implemented by software programs executable by the computing system 400. Further, in an exemplary, non-limited embodiment, implementations can include distributed processing, component/object distributed processing, and parallel processing. Alternatively, virtual computer system processing can be constructed to implement one or more of the methods or functionality as described herein.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any tangible medium that is capable of storing, encoding or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories, such as flash memory. Further, the computer-readable medium can be a random access memory or other volatile re-writable memory. Additionally, the computer-readable medium can include a magneto-optical or optical medium, such as a disk or tapes or other storage device to capture information communicated over a transmission medium. Accordingly, the disclosure is considered to include any one or more of a computer-readable medium or a distribution medium and other equivalents and successor media, in which data or instructions may be stored.

Any process descriptions or blocks in the figures, should be understood as representing modules, segments, or portions of code which include one or more executable instructions for implementing specific logical functions or steps in the process, and alternate implementations are included within the scope of the embodiments described herein, in which functions may be executed out of order from that shown or discussed, including substantially concurrently or in reverse order, depending on the functionality involved, as would be understood by those having ordinary skill in the art.

It should be emphasized that the above-described embodiments, particularly, any "preferred" embodiments, are possible examples of implementations, merely set forth for a clear understanding of the principles of the invention. Many variations and modifications may be made to the above-described embodiment(s) without substantially departing from the spirit and principles of the techniques described herein. All such modifications are intended to be included herein within the scope of this disclosure and protected by the following claims.

What is claimed is:

1. An apparatus, comprising:
    a vehicle battery;
    a processor to:
        generate a temperature gradient based on a change in temperature of the vehicle battery over a period of time;
        identify a fault value corresponding to the temperature gradient;
        determine an accumulated fault value by summing other fault values that correspond to previous periods of time;
        in response to determining the accumulated fault value exceeds a fault count threshold, lower a charging voltage of the vehicle battery;
        generate a subsequent temperature gradient based on a change in temperature of the vehicle battery over a subsequent period of time;
        identify a subsequent fault value corresponding to the subsequent temperature gradient;
        adjust the accumulated fault value by summing the fault value corresponding to the period of time and the other fault values corresponding to prior periods of time, and decreasing the accumulated fault value when the fault value is a negative value; and
        in response to determining the accumulated fault value exceeds the fault count threshold, lower the charging voltage of the vehicle battery.

2. The apparatus of claim 1, wherein the processor is further configured to: implement a remedial process when the accumulated fault value exceeds the fault count threshold, the remedial process including lowering the charging voltage that is charging the vehicle battery.

3. The apparatus of claim 1, wherein, to generate the temperature gradient, the processor is to by:
    receive, from a temperature sensor, temperature information identifying the temperature of the vehicle battery- as sensed by the temperature sensor; and
    measure the change in the temperature of the vehicle battery over the period of time based on the temperature information.

4. The apparatus of claim 1, wherein the period of time is a predetermined time stored in a memory.

5. The apparatus of claim 4, wherein the period of time is fifteen minutes.

6. The apparatus of claim 1, further including memory to store a set of predetermined fault values, each predetermined fault value of the set of predetermined fault values corresponds to a predetermined range of temperature gradients, wherein the processor is configured to identify the fault value corresponding to the temperature gradient by determining which predetermined range of temperature gradients the temperature gradient falls into.

7. The apparatus of claim 1, wherein the processor is configured to generate the temperature gradient after a predetermined amount of time has passed from the start of a vehicle battery charging operation for charging the vehicle battery.

8. A method for tracking a vehicle battery temperature, comprising:
    measuring, via a temperature sensor, a temperature of a vehicle battery;
    generating, via a processor, a temperature gradient based on a change in the temperature of the vehicle battery over a period of time
    identifying a fault value corresponding to the temperature gradient;
    determining an accumulated fault value by summing other fault values corresponding to prior periods of time; and
    lowering a charging voltage of the vehicle battery in response to determining the accumulated fault value exceeds a fault count threshold;
    generating a subsequent temperature gradient based on a change in temperature of the vehicle battery over a subsequent period of time;
    identifying a subsequent fault value corresponding to the subsequent temperature gradient;
    adjusting the accumulated fault value by summing the fault value corresponding to the period of time and the other fault values corresponding to the prior periods of time, and decreasing the accumulated fault value when the fault value is a negative value; and
    in response to determining the accumulated fault value exceeds the fault count threshold, lowering the charging voltage of the vehicle battery.

9. The method of claim 8, further comprising: implementing a remedial process when the accumulated fault value exceeds the fault count threshold, the remedial process includes lowering the charging voltage that is charging the vehicle battery.

10. The method of claim 8, wherein generating the temperature gradient comprises:
    receiving temperature information-from the temperature sensor that measures the temperature of the vehicle battery; and
    measuring the change in the temperature of the vehicle battery over the period of time based on the temperature information.

11. The method of claim 8, wherein the period of time is a predetermined time stored in memory.

12. The method of claim 11, wherein the period of time is fifteen minutes.

13. The method of claim 8, wherein identifying the fault value corresponding to the temperature gradient includes determining a predetermined range of temperature gradients stored in memory in which the temperature gradient falls, the memory stores a set of predetermined fault values, each predetermined fault value of the set of predetermined fault values corresponds to a predetermined range of temperature gradients.

14. The method of claim 8, wherein the temperature gradient is generated after a predetermined amount of time has passed from the start of a vehicle battery charging operation for charging the vehicle battery.

15. A battery diagnostic system, comprising:
    a vehicle battery;
    a temperature sensor configured to sense a temperature of the vehicle battery ;
    a processor to:
        generate a temperature gradient based on a change in the temperature of the vehicle battery over a period of time;

identify a fault value corresponding to the temperature gradient;

determine an accumulated fault value by summing other fault values corresponding to prior periods of time;

lower a charging voltage of the vehicle battery in response to determining the accumulated fault value exceeds a fault count threshold;

generate a subsequent temperature gradient based on a change in temperature of the vehicle battery over a subsequent period of time;

identify a subsequent fault value corresponding to the subsequent temperature gradient;

adjust the accumulated fault value by summing the fault value corresponding to the period of time and the other fault values corresponding to the prior periods of time, and decreasing the accumulated fault value when the fault value is a negative value; and in response to determining the accumulated fault value exceeds the fault count threshold, lower the charging voltage of the vehicle battery.

\* \* \* \* \*